United States Patent [19]

Homma et al.

[11] 4,366,558
[45] Dec. 28, 1982

[54] MEMORY DEVICE WITH FAST WORD-LINE-DISCHARGING-CIRCUITS

[75] Inventors: Noriyuki Homma, Kokubunji; Kunihiko Yamaguchi, Sayama, both of Japan

[73] Assignee: Hitachi, Ltd., Tokyo, Japan

[21] Appl. No.: 217,834

[22] Filed: Dec. 18, 1980

[30] Foreign Application Priority Data

Dec. 19, 1979 [JP] Japan .................................. 54-164043

[51] Int. Cl.³ .................... G11C 7/02; G11C 11/40; G11C 8/02
[52] U.S. Cl. .................................. 365/189; 365/203; 365/155; 365/233
[58] Field of Search ............... 358/189, 194, 154, 155, 358/233, 203

[56] References Cited

U.S. PATENT DOCUMENTS 4,156,941  5/1979  Homma et al. ..................... 365/189

Primary Examiner—John C. Martin
Attorney, Agent, or Firm—Antonelli, Terry and Wands

[57] ABSTRACT

In a memory comprising an upper word line and a lower word line for selecting memory cells connected therebetween, a delay circuit connected to the upper word line provides a first signal having a predetermined level when a voltage applied to the upper word line is between a selection voltage and a predetermined voltage, and a second signal, which is a delayed signal of the upper word line voltage signal, when the upper word line voltage changes from the predetermined voltage toward the non-selection voltage. The output of the delay circuit is used to control a switch circuit for discharging the lower word line therethrough.

10 Claims, 5 Drawing Figures t1  t2   t3  t4   t5

TIME

TIME

MEMORY DEVICE WITH FAST WORD-LINE-DISCHARGING-CIRCUITS

BACKGROUND OF THE INVENTION

This invention relates to a memory, and more particularly, to a bipolar memory.

In prior-art bipolar memories, each word line is constructed of a pair of word lines which consist of an upper word line and a lower word line, and memory cells are arranged at the points of intersection between each pair of word lines and pairs of data lines. The selection of the memory cell is executed by changing the voltage of the upper word line from a non-selection voltage to a selection voltage. In such a memory, in order to obtain a high speed for the memory selecting operation, it is necessary that after the word line is switched from select to non-select condition the word line voltage is changed at high speed from the selection voltage to the non-selection voltage.

FIG. 1 is a schematic circuit diagram of a memory which has previously been proposed to this end by the assignee of the present application in Japanese Published Unexamined patent application No. 53-41968 and in U.S. Pat. No. 4,156,941, which is herein incorporated by reference.

Shown in FIG. 1 are upper word lines $L_{X0}$ and $L_{X1}$, lower word lines $L_{ST0}$ and $L_{ST1}$, data lines $D_{00}$, $D_{01}$, $D_{10}$ and $D_{11}$, memory cells $C_0$–$C_3$ which are arranged at the points of intersection between the word and data lines, word line voltage-detecting circuits 20a and 20b which are respectively connected to the upper word lines $L_{X0}$ and $L_{X1}$, delay circuits 21a and 21b for delaying output signals of these detector circuits, switch circuits 22a and 22b which are disposed in correspondence with the respective lower word lines $L_{ST0}$ and $L_{ST1}$ in order to supply currents thereto in response to the levels of output signals of these delay circuits, and constant-current sources 10a and 10b for supplying constant currents to the lower word lines $L_{ST0}$ and $L_{ST1}$.

By way of example, when a pulse for selecting the upper word line $L_{X0}$ is applied to a terminal $X_0$, an emitter-follower transistor $Q_{201}$ detects the selection pulse. An emitter output of this transistor rises fast but its falling edge is delayed by the delay circuit 21a which is composed of transistors $Q_{202}$ and $Q_{203}$, resistances $R_{201}$–$R_{203}$, voltage sources $V_{EE}$, and capacitances $C_{201}$–$C_{203}$. This signal with the delayed falling edge is applied to the switch circuit 22a which is composed of a transistor $Q_{204}$ and a voltage source $V_{EE}$ as is disposed for the corresponding lower word line. Thus, even after the selection pulse has been removed from the upper word line $L_{X0}$, current is caused to flow from the switch circuit 22a to the lower word line $L_{ST0}$ for a predetermined period. It is characteristic of the proposed memory that the switch circuits are disposed in correspondence with the respective lower word lines and have the current sources respectively.

Voltage and current waveforms produced in the memory of FIG. 1 are illustrated in FIG. 2. FIG. 2(a) shows the voltage waveform of the selected upper word line, while FIG. 2(b) shows the waveform of the current ($\Delta I_{st}$) flowing through the transistor $Q_{204}$. As is apparent from the figure, the current $\Delta I_{st}$ starts flowing at a point $t_1$ at which the word line voltage $V_X$ begins to rise, and it reaches its maximum current value at a time $t_2$ at which the voltage $V_X$ arrives at a high level. Conversely, when the voltage $V_X$ falls, the current $\Delta I_{st}$ starts falling at a time $t_3$ at which the fall of the voltage $V_X$ is initiated. The current $\Delta I_{st}$ has its fall delayed by the delay circuit 21a or 21b and becomes zero at a time $t_5$. That is, the large current $\Delta I_{st}$ continues to flow at a time $t_4$ at which the voltage $V_X$ falls perfectly. As a result, the discharge of charges stored in stray capacitances $C_{S1}$ and $C_{S2}$ attendant upon the upper word line $L_{X0}$ and the lower word line $L_{ST0}$ respectively is effected at high speed, and the fall rates of the voltages of the word lines $L_{X0}$ and $L_{ST0}$ become high. In consequence, the access time and cycle time of the memory operation can be shortened as compared with prior memory circuits which lack the circuits 20a, 21a and 22a.

In addition to achieving a rapid fall, the circuit of FIG. 1 also decreases the influence of double selection occurring during the transition of the change-over of address signals as discussed below.

A large number of memory cells are usually arranged in the form of a matrix on a memory LSI chip, and in order to select desired cells from among them, a plurality of address signals are applied. The change-over of the address signals is effected by switching the levels of some of the plurality of address signals. Ideally, the switching of the levels should be simultaneous for all the address signals. Actually, however, some deviations are ordinarily involved in the timings at which the levels of the respective address signals applied to an address signal input pin are switched. This can be caused, for example, by unequal lengths of printed interconnections from gates for driving the address signals to the address signal input pin, and other circuit pecularities. Hereinbelow, this type of deviation shall be termed "address skew".

FIG. 3(a) shows an example of the switching of the address signals applied to the address signal input pin of FIG. 1. In the absence of any address skew, the respective address signals change as indicated by the solid lines. That is, at the time when the address signal $a_1$ switches from the high level to the low level, the other address signals, e.g., signals $a_2$ and $a_3$, switch from the low level to the high level. Accordingly, the change-over of the levels of the address signals occurs simultaneously. At this time, the voltage of the upper word line which shifts from the selected state into the non-selected state switches from the high level to the low level as illustrated by a waveform $b_1$ in FIG. 3(b), whereas the voltage of the upper word line which shifts from the non-selected state into the selected state switches as illustrated by a waveform $b_2$. The levels of both the waveforms $b_1$ and $b_2$ switch without a time lag relative to each other. All the voltages of the other upper word lines remain at the non-selection level.

In the presence of an address skew, however, the situation becomes different. By way of example, as illustrated by a broken line in FIG. 3(a), it is presumed that the address skew is involved in the address signal $a_3$, so the timing of the level switching of the signal $a_3$ lags over the timings of the level switchings of the other address signals $a_1$ and $a_2$. In this case, during the period after the levels of the signals $a_1$ and $a_2$ have switched and before the level of the signal $a_3$ switches, the upper word line which is determined by the condition that the signals $a_1$, $a_2$ and $a_3$ are at the low, high and low levels respectively is transiently selected. When the level of the signal $a_3$ has thereafter switched, the desired upper word line is selected. Accordingly, the voltage waveforms of the upper word lines in this case become as shown in FIG. 3(c).

Referring to these voltage waveforms shown in FIG. 3(c), in correspondence with the switchings of the levels of the signals $a_1$ and $a_2$, the voltage $b_1$ of the upper word line having been previously selected begins to fall, and the voltage $b_3$ of the different upper word line begins to rise transiently. However, this upper word line is selected only transiently, and its voltage $b_3$ rises only slightly and thereafter begins to fall. At this time after $a_3$ begins to rise, the actually desired upper word line begins to be selected, and its voltage $b_2$ begins to rise.

In the circuit of FIG. 1, in response to the fact that the voltage $b_3$ of the upper word line transiently selected has become greater than the non-selection voltage, the switch circuit connected to that upper word line causes the current $\Delta I_{st}$ to flow slightly to the corresponding lower word line. This raises the speed at which the voltage $b_3$ of the upper word line which was incorrectly transiently selected falls to the non-selection level. As a result, the voltage of the upper word line transiently selected can be returned to the non-selection level more quicky than in the absence of the switch circuits 22a and 22b. Thus, the circuit of FIG. 1 lessens the likelihood of the destruction of information.

However, for rendering the speed of the operation of the memory still higher, it is desirable that the voltage $b_3$ falls more rapidly as indicated by a voltage $b_4$ in FIG. 3(c). As illustrated in FIGS. 2(a) and 2(b), unless the voltage of the upper word line rises sufficiently, the current $\Delta I_{st}$ owing to the switch circuit 22a or 22b flows only slightly, and hence, the voltage $b_3$ cannot be lowered as rapidly as the voltage $b_4$. In a memory of very high operating speed, accordingly, information destruction sometimes takes place because two upper word lines have been simultaneously selected transiently. In FIG. 3, the case where an address skew is involved in only one address signal has been referred to. When two or more address signals involve respectively different skews, double or further multiple selection occurs and the situation worsens.

SUMMARY OF THE INVENTION

It is therefore an object of this invention to provide a memory which relieves the influence of the double selection due to address skews in the high-speed operating state.

To accomplish this object, the present invention consists in improving the delay circuit of the prior art by providing a delay circuit which generates a signal for controlling a switch circuit so that it may cause a sufficiently great current to flow to a lower word line even when an upper word line voltage has not reached a selection voltage.

DETAILED DESCRIPTION OF THE PREFERRED EMBODIMENT

Figure 1:
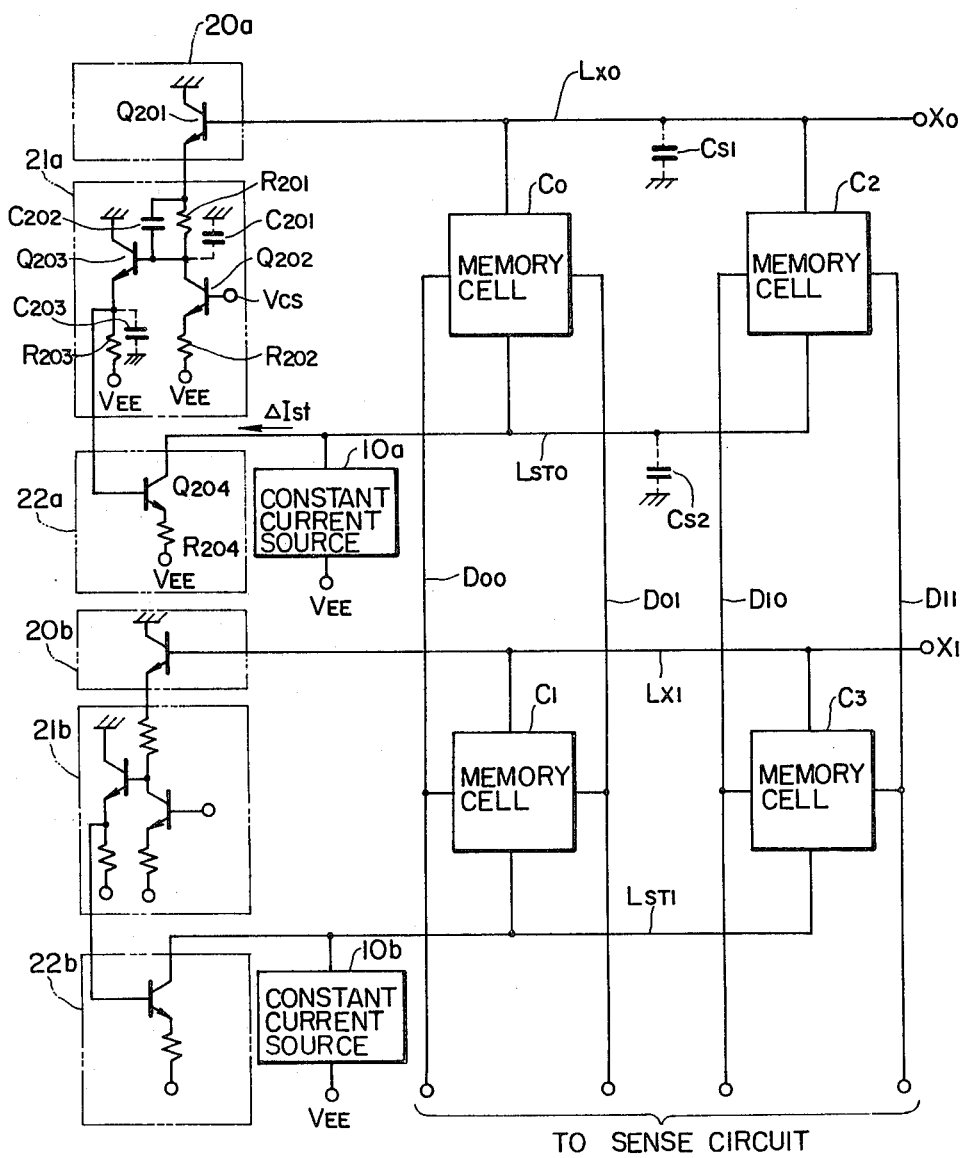
FIG. 1 is a circuit diagram of a prior-art bipolar memory.
Figure 2A:
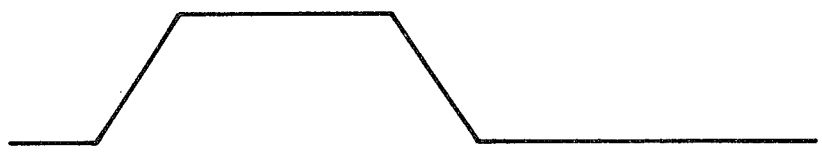
FIGS. 2(a) and 2(b) are time charts of signals for explaining the operation of the circuit in FIG. 1.
Figure 2B:
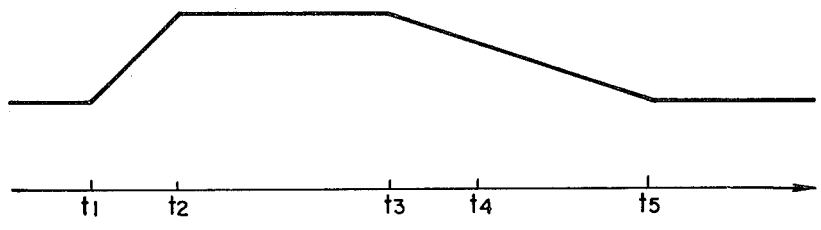
Figure 4:
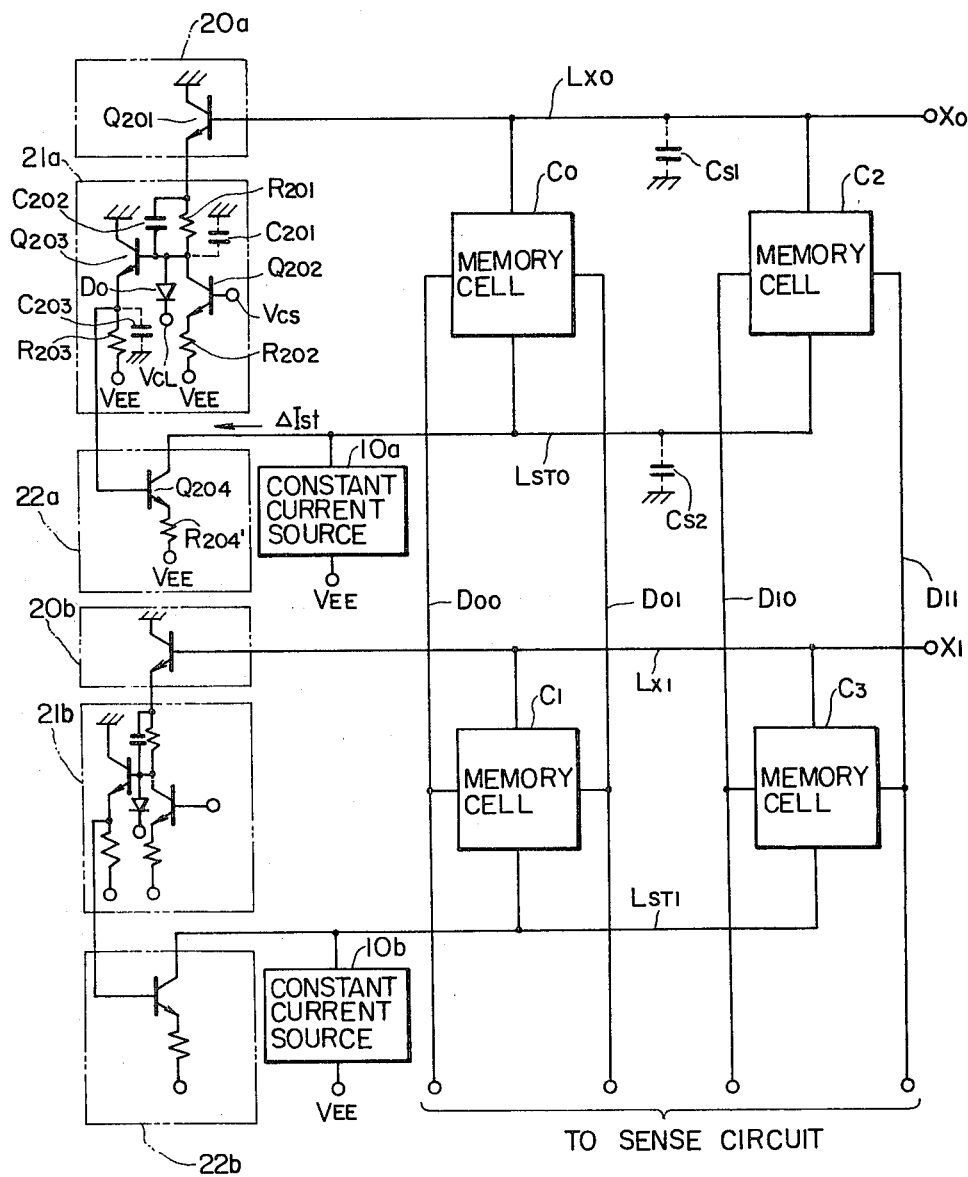
FIG. 4 is a circuit diagram of a memory according to the present invention.

An embodiment of this invention shown in FIG. 4, wherein like numerals designate like elements to FIG. 1, differs from the circuit of FIG. 1 in the point that a diode $D_0$ which has a voltage source $V_{CL}$ connected to its cathode is connected to the base of the transistor $Q_{203}$, and the point that the value of a resistance $R_{204}'$ is selected to be smaller than the value of the resistance $R_{204}$ in the circuit of FIG. 1. The diode $D_0$ serves to clamp the base voltage of the transistor $Q_{203}$ to the supply voltage $V_{CL}$.

Figure 5A:
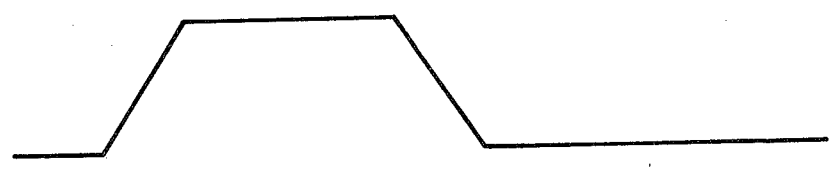
FIGS. 5(a) through 5(d) are time charts of signals for explaining the operation of the circuit in FIG. 4.

By way of example, as shown in FIG. 5(a), let it be supposed that in a case where the upper word line $L_{X0}$ is selected, the voltage of the word line $L_{X0}$ begins to rise from the non-selection voltage towards the selection voltage at a time $t_1$ until it reaches the selection voltage at a time $t_2$. This voltage then falls over from a time $t_3$ to a time $t_4$. The supply of the voltage to the word line $L_{X0}$ is executed by a known driver (not shown). The driver delivers the voltage pulse switching from the non-selection voltage to the selection voltage as stated above, to the upper word line to-be-selected in response to an address signal.

Figure 5B:

The emitter-follower transistor $Q_{201}$ detects this change of the voltage of the word line, and its emitter voltage changes with the same waveform as the waveform of FIG. 5(a). This voltage change produces a voltage change as shown in FIG. 5(b) in the base of the transistor $Q_{203}$ under the action of the resistance $R_{201}$ as well as the constant-current circuit which is composed of the transistor $Q_{202}$, the resistance $R_{202}$ and the voltage source $V_{EE}$. When the voltage of the word line $L_{X0}$ rises from the non-selection voltage towards the selection voltage, the base voltage of the transistor $Q_{203}$ also rises.

In this case, in order to prevent the base voltage of the transistor $Q_{203}$ from rising in a rise time longer than that of the voltage of the word line $L_{X0}$ under the action of the stray capacitance $C_{201}$ connected to the collector of the transistor $Q_{202}$ and to permit it to rise at substantially the same rise time as that of the voltage of the word line $L_{X0}$, the speeding-up capacitance $C_{202}$ is disposed in parallel with the resistance $R_{201}$.

However, after the voltage of the word line $L_{X0}$ has reached a predetermined voltage intermediate between the selection voltage and the non-selection voltage at a time $t_2'$ and the base voltage of the transistor $Q_{203}$ has become greater than a supply voltage $(V_{CL}+V_F)$ (where $V_F$ denotes the forward voltage drop of the diode $D_0$), this base voltage of the transistor $Q_{203}$ is clamped to the voltage $(V_{CF}+V_F)$ under the action of the diode $D_0$ even when the voltage of the word line $L_{X0}$ rises more.

Figure 5C:

The emitter voltage of the emitter-follower transistor $Q_{203}$ varies as shown in FIG. 5(c) in response to the change of the base voltage thereof. That is, the emitter voltage holds a fixed value after the time $t_2'$ at which the base voltage having risen in response to the rise of the voltage of the word line $L_{X0}$ reaches the supply voltage $(V_{CL}+V_F)$.

Figure 5D:
Figure 5D:
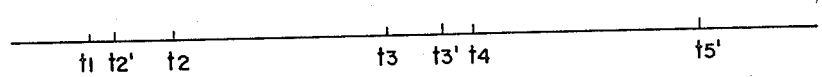

Depending upon this emitter voltage of the transistor $Q_{203}$, the switch circuit 22a causes a current as shown in FIG. 5(d) to the lower word line $L_{ST0}$. The switch circuit 22a has the value of the resistance $R_{204'}$ selected so that the allowable maximum current of the circuit may flow when the emitter voltage of the transistor $Q_{203}$ has reached the fixed value at the time $t_2'$. Thereafter, even when the voltage of the word line $L_{X0}$ rises more, the switch circuit 22a continues to cause the maximum current to flow because the base voltage of the transistor $Q_{203}$ is clamped.

Subsequently, as the voltage of the word line $L_{X0}$ begins to fall at the time $t_3$, the emitter voltage of the transistor $Q_{201}$ also begins to fall. However, the base voltage of the transistor $Q_{203}$ is kept clamped to the supply voltage $(V_{CL}+V_F)$ by the diode $D_0$, and the aforecited maximum current continues to flow from the switch circuit 22a.

When a time $t_3'$ is reached, the base voltage of the transistor $Q_{203}$ determined from the emitter voltage of the transistor $Q_{201}$ becomes smaller than the supply voltage $(V_{CL}+V_F)$, and the diode $D_0$ releases the clamping action. As a result, the base voltage of the transistor $Q_{203}$ begins to fall at the time $t_3'$. At this time, the emitter voltage of the transistor $Q_{203}$ has its fall rate retarded under the action of the stray capacitance $C_{203}$ connected to the emitter thereof. In consequence, even after the voltages of the upper word line $L_{X0}$ and the base of the transistor $Q_{203}$ have perfectly fallen to the non-selection levels at the time $t_4$, the emitter voltage of the transistor $Q_{203}$ continues to fall, and this voltage completes its fall at a time $t_5'$. In response to the fall of the emitter voltage of the transistor $Q_{203}$, the current of the switch circuit 22a similarly begins to fall at the time $t_3'$ and completes the fall at the time $t_5'$.

The circuits 20b, 21b and 22b connected to the other pair of word lines $L_{X1}$ and $L_{ST1}$ have the same arrangements and perform the same operations as the circuits 20a, 21a and 22a connected to the pair of word lines $L_{X0}$ and $L_{ST0}$, respectively.

Figure 3A:
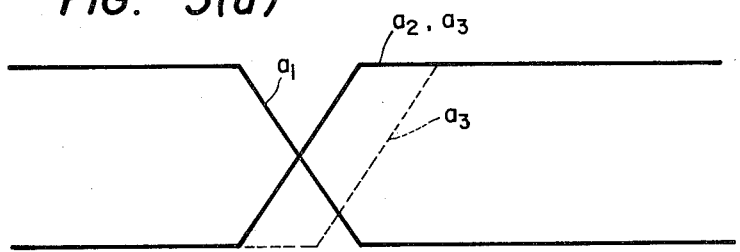
FIGS. 3(a), 3(b) and 3(c) are diagrams illustrative of the changes of word line voltages for explaining a problem of the circuit in FIG. 1.
Figure 3B:
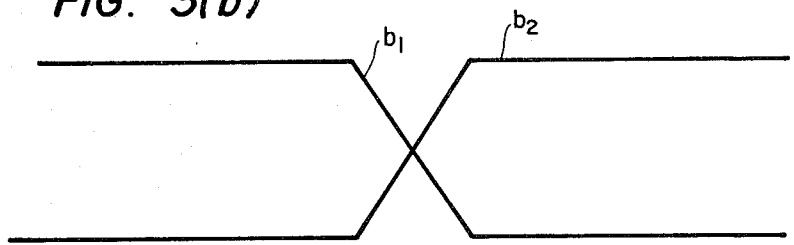
Figure 3C:
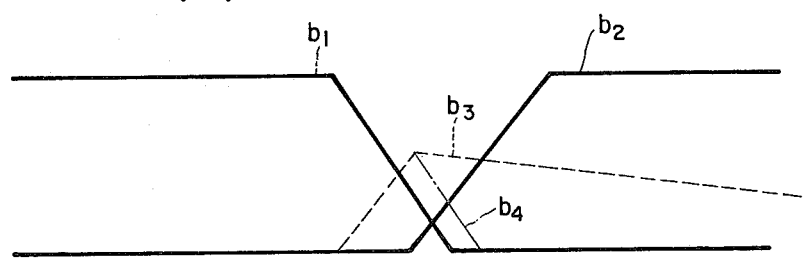

The delay circuits 21a and 21b and the switch circuits 22a and 22b are constructed as described above, whereby the double selection of the word lines ascribable to an address skew is prevented. As illustrated by the waveform $b_3$ in FIG. 3(c), in a case where a certain upper word line, e.g., $L_{X0}$ has been transiently selected due to the address skew, the voltage of this word line $L_{X0}$ rises from the non-selection voltage and thereafter falls. According to this invention, the switch circuit 21a causes the maximum allowable current to flow before the voltage of the word line $L_{X0}$ reaches the selection voltage. Therefore, even when the voltage of the word line $L_{X0}$ transiently selected is comparatively small, a current greater than that in the prior art flows from the switch circuit 22a in the delayed fashion. It is accordingly possible to significantly increase the speed at which the voltage of the transiently selected word line falls to the non-selection voltage.

In order to permit the allowable maximum current to flow from the switch circuit before the word line voltage reaches the selection level as described above, the curent $\Delta I_{st}$ is caused to flow to the memory cell connected to the selected word line immediately after the initiation of the selection of the word line. Accordingly, this invention also has the beneficial result that the information of the memory cell connected to the word line which shifts from the non-selected state into the selected state is more difficult to destroy.

This invention is not restricted to the foregoing embodiment, but also covers other circuit arrangements such as those which are disclosed in the specification of Japanese Published Unexamined patent application No. 53-41968 and U.S. Pat. No. 4,156,941. For example, although the word line voltage-detecting circuit 20a is shown as being connected to the upper word line and is constructed so as to deteсct the change of voltage of the particular word line, it can be replaced with a word line voltage-detecting circuit which is connected to the driver (not shown) for applying the voltage to the upper word line. Such an arrangement could be constructed so as to detect a voltage change within the driver and to substitute this detection for the detection of the change of the word line voltage. Also, the voltage-detecting circuit 20a may be omitted in FIG. 4. In this case, the resistance $R_{201}$ and the capacitors $C_{202}$ would be connected directly to the word line $L_{X0}$.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A memory comprising:
   a plurality of pairs of word lines, each pair of which comprises an upper word line and a lower word line,
   a plurality of memory cells which are connected between the word lines of the respective pairs of word lines,
   a plurality of voltage application means disposed in correspondence with said respective pairs of word lines for applying either a selection voltage or a non-selection voltage to the upper word lines of the corresponding pairs of word lines,
   current sources which are disposed for said respective pairs of word lines and which are connected to the lower word lines in the corresponding pairs of word lines,
   delay circuits which are connected to said voltage application means, and
   switching means coupled to said delay circuits and said current sources for controlling magnitudes of currents to be supplied from said current sources to the corresponding lower word lines, depending upon levels of output signals of said delay circuits,
   wherein said each delay circuit includes means for providing a first signal of a predetermined level while the output of the corresponding voltage application means exceeds a predetermined first voltage intermediate between said selection voltage and said non-selection voltage, and for providing a second signal obtained by delaying an output of said corresponding voltage application means, when said output of said voltage application means has changed in a direction from said predetermined first voltage towards said non-selection voltage.

2. A memory as defined in claim 1, wherein said each delay circuit comprises means for delaying the output of said corresponding voltage application means, and clamping means for controlling an output of the delaying means to said predetermined level when said output of said corresponding voltage application means is intermediate between said first voltage and said selection voltage.

3. A memory as defined in claim 2, wherein said delay circuits are a plurality of delay circuits which are respectively connected to the corresponding upper word lines.

4. A memory as defined in claim 3, wherein said delay circuits and said switching means are respectively disposed in correspondence with said pairs of word lines 5. A memory as defined in claim 1 or 2, wherein said each delay circuit includes means for generating a signal having a greater fall time than the fall time of the output of said corresponding voltage application means when said output of said corresponding voltage application means falls from said first voltage towards said non-selection voltage.

6. A memory as defined in claim 5, wherein said each delay circuit provides a signal rising in a rise time substantially equal to that of said output of said corresponding voltage application means when said output of said corresponding voltage application means rises from said non-selection voltage towards said first voltage.

7. A memory as defined in claim 6, wherein said each delay circuit comprises a first emitter-follower transistor whose base has the output of said corresponding voltage application means applied thereto, a second emitter-follower transistor whose base is connected to an emitter of said first emitter-follower transistor, and a clamping diode which is connected to said base of said second emitter-follower transistor.

8. A semiconductor memory comprising:
a memory array including a number of memory cells arranged in the form of a matrix, each memory cell being connected between a first word line to which a word line addressing signal having select and non-select levels is applied and a second word line to which a constant current source is connected;
first means for detecting said word line addressing signals applied to said first word line;
second means coupled to said first detecting means, said second means including:
means for providing a first output signal having a rise time substantially equal to the rise time of the word line addressing signal as it increases from its non-select level to a level intermediate between the non-select level and a select level;
means for clamping said first output signal at said intermediate level when the select addressing means reaches said intermediate level in increasing from the non-select level to the select level; and
means for releasing the clamp on said first output signal and producing a second output signal at a time when said word line addressing signal in changing from the select level to the non-select level drops below said intermediate level, wherein the fall time of said second output signal is greater than the fall time of said word line addressing signal in falling from said intermediate level to said non-select level;
switching means coupled to said second means and to said lower word line for controlling the current flow in said second word line in accordance with the output signals of said second means.

9. A semiconductor memory as defined in claim 8, wherein said means for clamping comprises a diode having an anode coupled to said first detecting means and a cathode coupled to a reference voltage source.

10. A semiconductor memory as defined in claim 8 or 9, wherein the switching means includes means for providing maximum current flow through said second word line when the first signal from the second means is clamped at said intermediate level.

* * * * *